(12) United States Patent
Nakasato

(10) Patent No.: US 6,908,858 B2
(45) Date of Patent: Jun. 21, 2005

(54) METHOD OF FABRICATING SEMICONDUCTOR DEVICE HAVING OPENING FILLED UP WITH FILLER

(75) Inventor: Mayumi Nakasato, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 11 days.

(21) Appl. No.: 09/985,012

(22) Filed: Nov. 1, 2001

(65) Prior Publication Data

US 2002/0055258 A1 May 9, 2002

(30) Foreign Application Priority Data

Nov. 8, 2000 (JP) .......................................... 2000-340092
Oct. 16, 2001 (JP) .......................................... 2001-317734

(51) Int. Cl.⁷ .......................................... H01L 21/302
(52) U.S. Cl. .................. 438/689; 438/692; 438/700; 438/702
(58) Field of Search ................................ 438/689, 692, 438/693, 700, 702, 691, 745, 756, 757; 216/38, 88, 89

(56) References Cited

U.S. PATENT DOCUMENTS

| | | | | |
|---|---|---|---|---|
| 5,494,857 A | * | 2/1996 | Cooperman et al. | ..... 438/692 X |
| 5,863,828 A | * | 1/1999 | Snyder | ..... 438/692 X |
| 5,958,795 A | * | 9/1999 | Chen et al. | ..... 438/692 |
| 6,015,757 A | * | 1/2000 | Tsai et al. | ..... 438/697 |
| 6,258,676 B1 | * | 7/2001 | Lee et al. | ..... 438/296 |
| 6,261,923 B1 | * | 7/2001 | Kuo et al. | ..... 438/427 |
| 6,506,681 B2 | * | 1/2003 | Grigg et al. | ..... 438/692 |

FOREIGN PATENT DOCUMENTS

| | | |
|---|---|---|
| JP | 10-284704 | 10/1998 |
| JP | 10-313051 | 11/1998 |
| JP | 11-312730 | 11/1999 |
| JP | 11-340312 | 12/1999 |

* cited by examiner

*Primary Examiner*—Nadine G. Norton
*Assistant Examiner*—Lynette T. Umez-Eronini
(74) *Attorney, Agent, or Firm*—McDermott Will & Emery LLP (57) ABSTRACT

A method of fabricating a semiconductor device capable of relaxing pattern dependency in a planarization step is obtained. This method of fabricating a semiconductor device comprises steps of filling up an opening with a filler while forming the filler on the opening and on a non-opening part, forming a mask layer at least on a part of the filler located on the opening, etching a region, formed with no mask layer, of a part of the filler located on the non-opening part by a prescribed thickness through a mask of the mask layer, and thereafter scraping the upper surface of the filler located on the opening and on the non-opening part thereby performing surface planarization. Thus, the width of the upper surface of the part of the filler located on the non-opening part having a large height is reduced. Therefore, the part having a large height is so readily removed that the planarized surface can be prevented from dispersion.

15 Claims, 4 Drawing Sheets

FIG.11 PRIOR ART

METHOD OF FABRICATING SEMICONDUCTOR DEVICE HAVING OPENING FILLED UP WITH FILLER

BACKGROUND OF THE INVENTION

1. Field of the Invention

The present invention relates to a method of fabricating a semiconductor device, and more specifically, it relates to a method of fabricating a semiconductor device having an opening filled up with a filler.

2. Description of the Prior Art

As the degree of integration of a semiconductor device is recently increased, a technique of finely working the semiconductor device is becoming increasingly important. Element isolation for isolating semiconductor elements provided in a semiconductor device from each other is known as one of fine working techniques. In this element isolation, a technique referred to as trench isolation is frequently employed following high integration of the semiconductor device.

In this trench isolation, an element isolation trench is formed in a semiconductor substrate and filled up with an insulating material or the like, thereby physically and electrically isolating element regions located on both sides of the trench from each other.

In general, this trench isolation is carried out basically through four steps including a first step of depositing a silicon nitride film on the surface of a silicon substrate through a silicon oxide film, a second step of patterning a part of the silicon nitride film for defining an element isolation region by etching and thereafter forming an element isolation trench through a mask of the patterned part of the silicon nitride film, a third step of thermally oxidizing the surface of the trench and thereafter depositing a silicon oxide film so that the thickness thereof is larger than the total of the depth of the trench and the thickness of the silicon nitride film and a fourth step of performing planarization by polishing and removing the silicon oxide film by chemical mechanical polishing (CMP) through the silicon nitride film serving as a stopper film.

The degree of integration of the semiconductor device can be readily increased due to the aforementioned trench isolation. However, the trench isolation has the following problems:

After the trench is formed, a silicon oxide film, for example, is temporarily deposited in the aforementioned third step for filling up the trench with an insulating material. In this case, a large step (irregularity) may be formed on the surface of the deposited silicon oxide film due to the trench pattern. In other words, a concave portion is formed on a surface part of the silicon oxide film located on the trench while a convex portion is formed on a surface part of the silicon oxide film located on a portion other than the trench. Particularly when the trench has a large opening area, a large step is formed on the surface of the silicon oxide film. In this case, the planarized surface is dispersed in the aforementioned fourth step due to the trench pattern, and hence it is difficult to normally perform planarization. This problem is now described in detail with reference to FIGS. 10 and 11.

Figure 10:
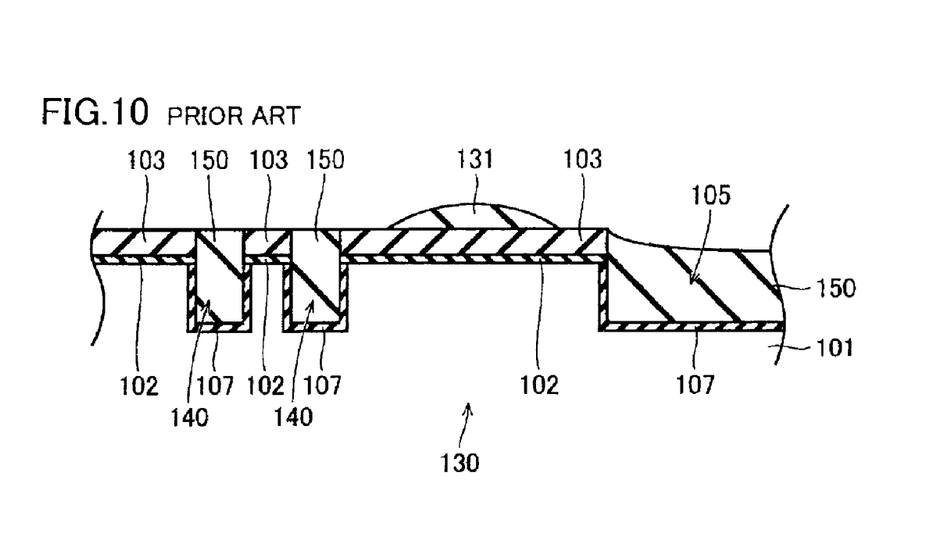
FIG. 10 is a sectional view showing a conventional semiconductor device after planarization.

In a conventional structure shown in FIG. 10, a trench 105 having a large opening area and trenches 140 having small opening areas are formed on the surface of a silicon substrate 101. Thermal oxide films 107 are formed on the surfaces of the trenches 105 and 140. Silicon nitride films 103 are formed on regions not formed with the trenches 105 and 140 through silicon oxide films 102. The trenches 105 and 140 are filled up with silicon oxide films 150 serving as fillers.

When planarization is performed on the conventional structure shown in FIG. 10 by trench isolation, the surface of the silicon oxide film 150 embedded in the trench 105 after planarization is located downward beyond a part of the upper surface of the silicon substrate 101 located on an element region 130 for defining an active region. In the element region 130 having a large width, a silicon oxide film 131 deposited in the aforementioned third step is neither polished nor removed but remains on the silicon nitride film 103 after planarization. In the conventional element isolation shown in FIG. 10, the surface of the silicon oxide film 131 deposited in the third step is irregularized due to the trench pattern, to disadvantageously result in surface dispersion after planarization.

Figure 11:
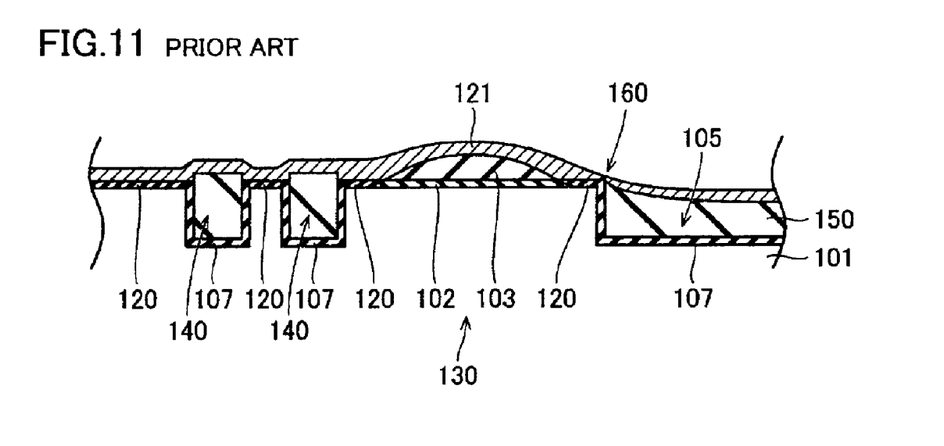
FIG. 11 is a sectional view showing the conventional semiconductor device formed with a gate electrode.

The aforementioned surface dispersion after planarization results in the following problem: When the silicon nitride films 103 and the silicon oxide films 102 are removed from the state shown in FIG. 10 followed by formation of gate oxide films 120 and a gate electrode 121 as shown in FIG. 11, the gate electrode 121 is formed to cover a step 160 between the silicon oxide film 150 and the surface of the substrate 101. Therefore, field concentration may take place on the step 160 adjacent to the active region, to disadvantageously cause a leakage current between the gate electrode 121 and the active region.

When the silicon nitride films 103 and the silicon oxide films 102 are removed from the state shown in FIG. 10, further, the silicon oxide film 131 remaining on the element region 130 disadvantageously defines a mask to disadvantageously hinder removal of the silicon nitride film 103 and the silicon oxide film 102 located under the same. If the silicon nitride film 103 and the silicon oxide film 102 remain unremoved due to the silicon oxide film 131, the gate electrode 121 is formed on the silicon nitride film 103 as shown in FIG. 11. In this case, the threshold voltage of a transistor is so abnormally increased that the transistor cannot be used.

The aforementioned problems are not restricted to trench isolation but similar problems are caused also in a method of fabricating a semiconductor device comprising a step of filling up an opening such as a trench or a hole with a filler and thereafter planarizing the surface thereof.

SUMMARY OF THE INVENTION

An object of the present invention is to provide a method of fabricating a semiconductor device capable of relaxing pattern dependency in a planarization step.

Another object of the present invention is to effectively utilize an underlayer film as a stopper film for planarization through difference in selectivity between a filler and the underlayer film in the aforementioned method of fabricating a semiconductor device.

Still another object of the present invention is to readily perform planarization without causing surface dispersion in the aforementioned method of fabricating a semiconductor device.

A method of fabricating a semiconductor device according to an aspect of the present invention comprises steps of filling up an opening with a filler while forming the filler on the opening and on a non-opening part, forming a mask layer at least on a part of the filler located on the opening, etching a region, formed with no mask layer, of a part of the filler located on the non-opening part by a prescribed thickness through a mask of the mask layer, and thereafter scraping the upper surface of the filler located on the opening and on the non-opening part thereby performing surface planarization.

In the method of fabricating a semiconductor device according to this aspect, the mask layer is formed at least on the part of the filler located on the opening while the region, formed with no mask layer, of the part of the filler located on the non-opening part is etched by the prescribed thickness, so that the width of the upper surface of the part, having a large height, of the filler located on the non-opening part can be reduced. Thus, the part having a large height is readily removed, whereby pattern dependency in the planarization step can be relaxed. Consequently, the surface can be prevented from dispersion after planarization.

In the method of fabricating a semiconductor device according to this aspect, the region of the filler not formed with the mask layer is not completely removed by etching but etched by the prescribed thickness so that an underlayer film can be effectively utilized as a stopper film for planarization due to the difference in selectivity between the filler and the underlayer film. If the surface of the underlayer film is exposed from the start, it is difficult to detect an end point of planarization performed by polishing or the like. According to this aspect of the present invention, the end point of polishing can be readily detected through the underlayer film serving as a stopper film by etching the aforementioned region of the filler by the prescribed thickness.

In the method of fabricating a semiconductor device according to the aforementioned aspect, the step of performing surface planarization preferably includes a step of performing the surface planarization by polishing the upper surface of the filler by chemical mechanical polishing. According to this structure, the surface planarization can be readily performed. In this case, the step of performing surface planarization preferably includes a step of performing the surface planarization by polishing the upper surface of the filler by chemical mechanical polishing thereby substantially entirely removing the part of the filler located on the non-opening part. According to this structure, planarization can be performed with no dispersion on the surface.

In the method of fabricating a semiconductor device according to the aforementioned aspect, the non-opening part preferably includes an element forming region formed on the surface of a semiconductor substrate, and the opening preferably includes an element isolation trench formed on the surface of the semiconductor substrate. According to this structure, the element isolation trench can be readily planarized by trench isolation.

In the method of fabricating a semiconductor device according to the aforementioned aspect, the step of etching the region of the part of the filler by a prescribed thickness preferably includes a step of etching the region of the part of the filler by a thickness allowing elimination of pattern dependency when polishing the filler located on the non-opening part and on the opening by chemical mechanical polishing. According to this structure, planarization can be readily performed by chemical mechanical polishing. In this case, the step of etching the region of the part of the filler by a prescribed thickness preferably includes a step of etching the region of the part of the filler by a prescribed thickness so that the upper surface of the etched region of the part of the filler is substantially flush with the upper surface of the part of the filler located on the opening. According to this structure, pattern dependency can be readily eliminated when performing planarization by chemical mechanical polishing.

In this case, the method of fabricating a semiconductor device preferably further comprises a step of forming an etching mask on a prescribed region of a semiconductor substrate and thereafter etching the semiconductor substrate through the etching mask thereby forming the opening, and the step of etching the region of the part of the filler by a prescribed thickness preferably includes a step of etching the region of the part of the filler by the total of the depth of the opening and the thickness of the etching mask after formation of the opening. According to this structure, the upper surface of the etched part of the filler can readily be substantially flush with the upper surface of the part of the filler located on the opening, whereby pattern dependency can be readily eliminated when performing planarization by chemical mechanical polishing.

In the method of fabricating a semiconductor device according to the aforementioned aspect, the step of forming the mask layer preferably includes a step of forming the mask layer not only on the part of the filler located on the opening but also on a prescribed region of the part of the filler located on the non-opening part. Thus, also when the mask layer is displaced, the part, having a small height, of the filler formed on the opening can be prevented from being etched. In other words, a margin (fabrication margin) for the etching process can be ensured.

In this case, the width of a part of the mask layer formed on the prescribed region of the part of the filler located on the non-opening part is so set that an unetched portion, located under the mask layer, and an etched portion, not located under the mask layer, of the part of the filler located on the non-opening part are completely removed by the chemical mechanical polishing at substantially equal points of time. According to this structure, planarization can be performed by chemical mechanical polishing with no dispersion on the surface. In this case, the width of the part of the mask layer formed on the prescribed region of the part of the filler located on the non-opening part is less than about 100 $\mu$m. Thus, the unetched portion, located under the mask layer, and the etched portion, not located under the mask layer, of the part of the filler located on the non-opening part can be readily completely removed by the chemical mechanical polishing at substantially equal points of time.

In the aforementioned case, the step of forming the mask layer may include a step of forming the mask layer substantially on the overall surface of a part of the filler located on a portion of the non-opening part having a small width while forming the mask layer on a part of the filler located on another portion of the non-opening part having a large width. According to this structure, only the part of the filer, located on the portion of the non-opening part having a large width, influencing pattern dependency can be etched. In this case, the width of the part of the mask layer formed substantially on the overall surface of the part of the filler located on the portion of the non-opening part having a small width is preferably less than about 100 $\mu$m. According to this structure, the part of the filler located on the portion of the non-opening part having a small width can be readily removed by chemical mechanical polishing without etching this part of the filler.

The method of fabricating a semiconductor device according to the aforementioned aspect preferably further comprises a step of forming a position detection groove in the non-opening part, the mask layer is preferably formed on a region other than a region located on the position detection groove, and the step of etching the region of the part of the filler by a prescribed thickness preferably includes a step of also etching a part of the filler located in the position detection groove at the same time. Thus, also when a wiring material is formed in the position detection groove in a later step, the height of the upper surface of the wiring material can be located downward beyond the edge of the position detection groove. Therefore, position detection can be performed in a step of forming a wiring layer, for example, through a step around the edge of the position detection groove.

The method of fabricating a semiconductor device according to the aforementioned aspect preferably further comprises steps of forming a silicon nitride film on a prescribed region of a semiconductor substrate and etching the semiconductor substrate through a mask of the silicon nitride film thereby forming an element isolation trench as the opening, the step of forming the filler preferably includes a step of filling up the element isolation trench with the filler while forming the filler, including a silicon oxide film, on the element isolation trench and on the non-opening part, and the step of performing surface planarization preferably includes a step of performing the surface planarization by polishing the upper surface of the filler located on the element isolation trench and on the non-opening part by chemical mechanical polishing through a stopper of the silicon nitride film. According to this structure, surface planarization can be readily performed by chemical mechanical polishing when forming an element isolation region by trench isolation.

In the method of fabricating a semiconductor device according to the aforementioned aspect, the step of performing surface planarization preferably includes a step of performing the surface planarization by removing the upper surface of the filler by microblasting. According to this structure, surface planarization can be readily performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

Figure 1:
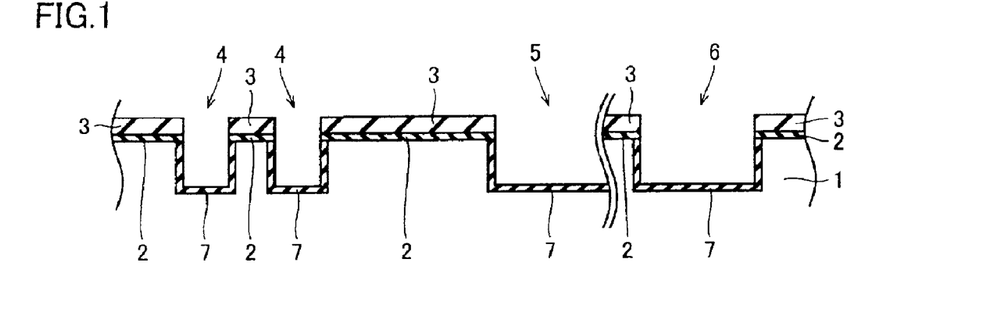
FIGS. 1 to 8 are sectional views for illustrating a method of fabricating a semiconductor device according to an embodiment of the present invention.

A method of fabricating a semiconductor device according to the embodiment of the present invention is described with reference to FIGS. 1 to 8. First, a thermal oxide film 2 having a thickness of about 10 nm and a silicon nitride film 3 having a thickness of about 150 nm are successively formed on a semiconductor substrate 1 of silicon, and the silicon nitride film 3 is thereafter patterned by photolithography and etching, as shown in FIG. 1. The patterned silicon nitride films 3 are employed as masks for etching the thermal oxide film 2 and etching the semiconductor substrate 1 by about 300 nm, thereby forming trenches 4 having small opening areas, a trench 5 having a large opening area and a position detection groove 6. The trenches 4 and 5 and the position detection groove 6 are formed to have a depth of about 300 nm.

The surfaces of the openings of the trenches 4 and 5 and the position detection groove 6 are oxidized, thereby forming thermal oxide films 7 having a thickness of about 20 nm. This thermal oxidation of the surfaces of the trenches 4 and 5 is performed for rounding the upper ends of the openings of the trenches 4 and 5.

Figure 2:
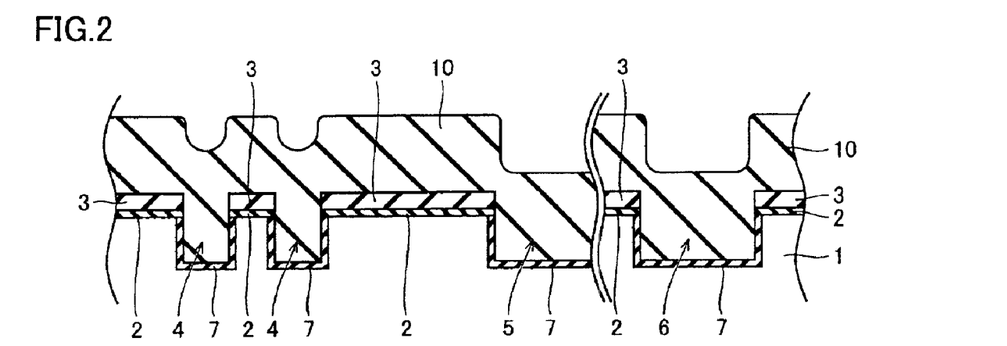

Then, a silicon oxide film 10 for defining fillers is deposited on the overall surface in a thickness of about 600 nm, as shown in FIG. 2. This silicon oxide film 10 is deposited to cover the overall surfaces of the silicon nitride films 3, and formed to be higher than the silicon nitride films 3 above the trenches 4 and 5. The silicon oxide film 10 fills up the trenches 4 and 5, thereby forming element isolation regions for isolating both sides of the trenches 4 and 5 from each other.

After filling up the trenches 4 and 5 with the silicon oxide film 10 as described above, the process advances to a stage of preparation for performing planarization by CMP through the silicon nitride films 3 serving as stoppers. In the state shown in FIG. 2, the upper surface of the silicon oxide film 10 is undulated (irregularized) due to the opening patterns of the semiconductor substrate 1 and the films formed thereon such as the opening patterns of the trenches 4 and 5 and the silicon nitride films 3. When the silicon oxide film 10 having such an undulated upper surface is planarized by CMP, the surface is dispersed depending on the patterns as described above, and hence it is difficult to ensure flatness of the surface.

Figure 3:
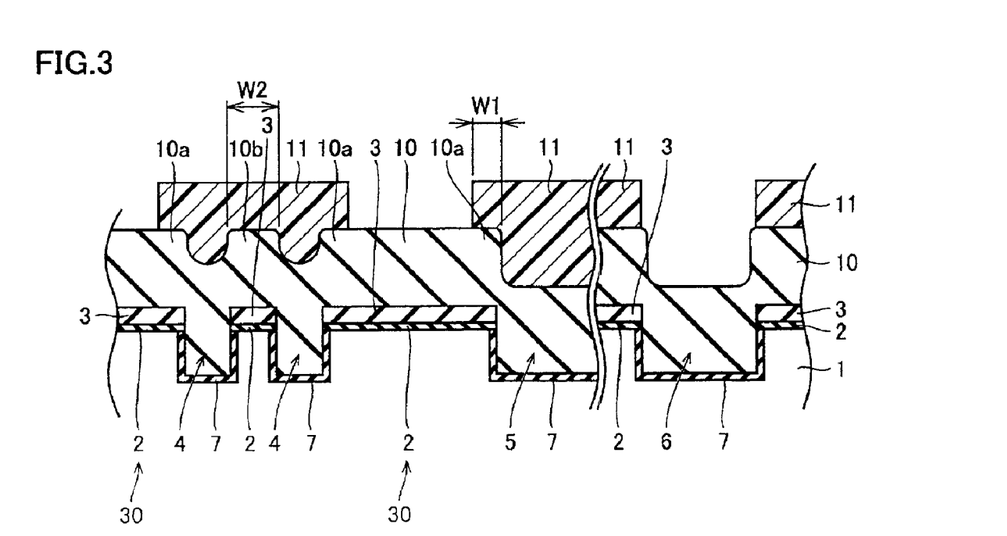
Figure 4:
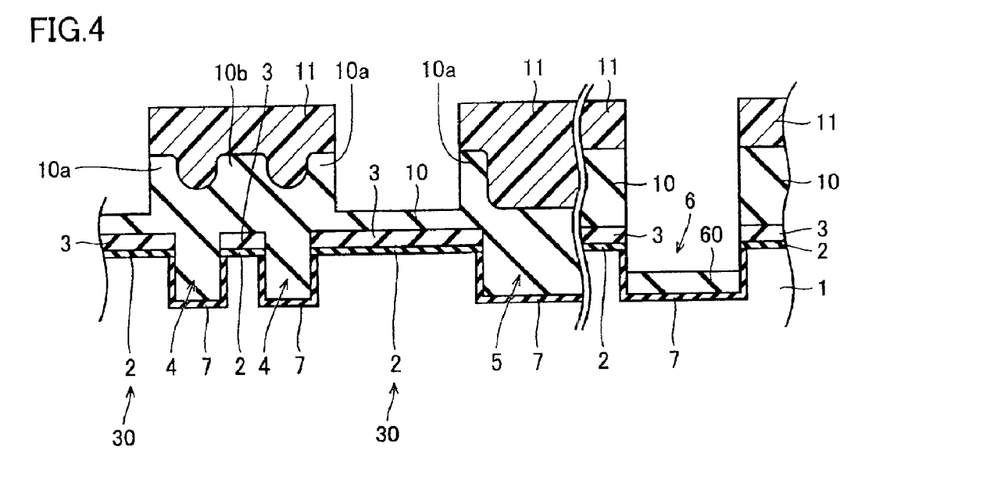

According to this embodiment, therefore, mask layers 11 are formed above the trenches 4 and 5, as shown in FIG. 3. No mask layer 11 is formed above the position detection groove 6. Parts of the silicon oxide film 10 deposited on regions other than those located on the trenches 4 and 5 are partially anisotropically etched by a prescribed thickness, thereby forming concave portions above wide element regions 30, as shown in FIG. 4. In this case, the silicon oxide film 10 is etched by a quantity corresponding to the total of the depth of the trench 5 and the thickness of the silicon nitride films 3 after formation of the trench 5. The reason for this is as follows: After deposition of the silicon oxide film 10, the height of the part of the silicon oxide film 10 located on the trench 5 having a large opening area is smaller than the height of the parts of the silicon oxide film 10 located on the element regions 30 by a value corresponding to the total of the depth of the trench 5 and the thickness of the silicon nitride films 3 after formation of the trench 5. In this case, the small thickness of the silicon nitride films 2 is approximately ignored. When the quantity of etching is set to the value corresponding to the total of the depth of the trench 5 and the thickness of the silicon nitride films 3 after formation of the trench 5, therefore, the parts of the silicon oxide film 10 deposited on the wide element regions 30 can be substantially flush with the part of the silicon oxide film 10 located on the trench 5. Thus, pattern dependency can be relaxed in the later CMP step.

When the parts of the silicon oxide film 10 deposited on the regions other than those located on the trenches 4 and 5 are partially etched as described above, the width of parts of the silicon oxide film 10 having upper surfaces higher than the remaining regions can be so reduced that the parts having high upper surfaces can be quickly removed. Consequently, pattern dependency after completion of CMP can be relaxed.

The regions of the silicon oxide film 10 not formed with the mask layers 11 are not completely removed by etching but etched only by a prescribed thickness, so that the silicon nitride films 3 can be effectively utilized as stopper films for planarization through the difference in selectivity between the silicon oxide film 10 and the silicon nitride films 3 serving as underlayer films. When the surfaces of the silicon nitride films 3 necessary for detecting end points of polishing by CMP are exposed from the start, it is difficult to detect the end points. According to this embodiment, the aforementioned parts of the silicon oxide film 10 are etched by a prescribed thickness, so that the end points of polishing by CMP can be readily detected through the silicon nitride films 3 serving as stopper films.

The mask layers 11 are provided with margins having a width W1 so that the low upper surface portion of the silicon oxide film 10 located on the trench 5 is not etched also when the mask layers 11 are displaced in the step shown in FIG. 3. These margins of the mask layers 11 are located above the wide element regions 30. In other words, the mask layers 11 are formed not only above the trenches 4 and 5 but also above parts of the element regions 30 according to this embodiment.

The width W1 of the margins corresponds to the width of margins 10a of the silicon oxide film 10 substantially completely removed while a portion, having the maximum line width W2, of a part 10b of the silicon oxide film 10 located on the space between the two adjacent trenches 4 is removed by CMP. When the width W1 of the margins is set in such a manner, the margins 10a of the silicon oxide film 10 can also be removed when the part 10b of the silicon oxide film 10 located on the space between the adjacent trenches 4 is removed. Therefore, the width W1 of the margins can be employed as a standard for eliminating pattern dependency in the CMP step.

The maximum value of the width W1 of the margins is set to less than about 100 μm in this embodiment. This point is now described with reference to FIG. 9.

Figure 9:
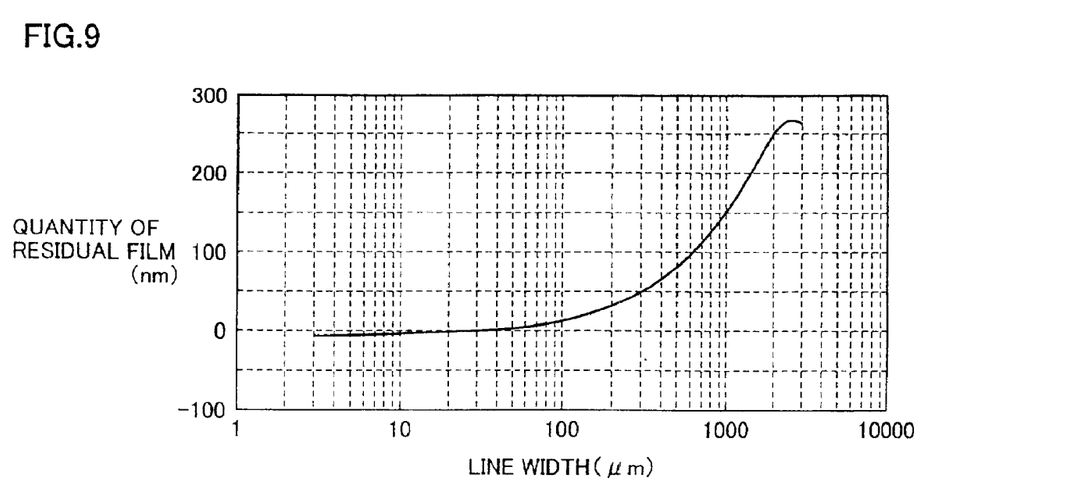
FIG. 9 is a correlation diagram showing the relation between line widths and quantities of residual films.

FIG. 9 shows quantities of residual parts of a silicon oxide film having various line widths at a point of time when a part of the silicon oxide film having a line width of 10 μm is completely removed by CMP. As clearly understood from FIG. 9, parts of the silicon oxide film having line widths of less than 100 μm are substantially completely removed when the part of the silicon oxide film having the line width of 10 μm is completely removed by CMP. Therefore, the undulation of the silicon oxide film 10 can be quickly relaxed in the CMP step by setting both of the line width W2 of the unetched part 10b of the silicon oxide film 10 located on the space between the adjacent trenches 4 and the line width W1 of the margins 10a to less than 100 μm.

As shown in FIG. 4, the parts of the silicon oxide film 10 located above the wide element regions 30 are etched through the mask layers 11 thereby forming concave portions having bottom surfaces substantially flush with the upper surface of the part of the silicon oxide film 10 located on the trench 5, and the mask layers 11 are thereafter removed. Thus, a shape shown in FIG. 5 is obtained.

No mask layer 11 is formed above the position detection groove 6 in the step shown in FIG. 3, and hence the part of the silicon oxide film 10 located on the position detection groove 6 is also etched by a prescribed quantity in the step shown in FIG. 4. Thus, a filler 60 of silicon oxide having a thickness smaller than the depth of the position detection groove 6 is formed in the position detection groove 6.

Figure 5:
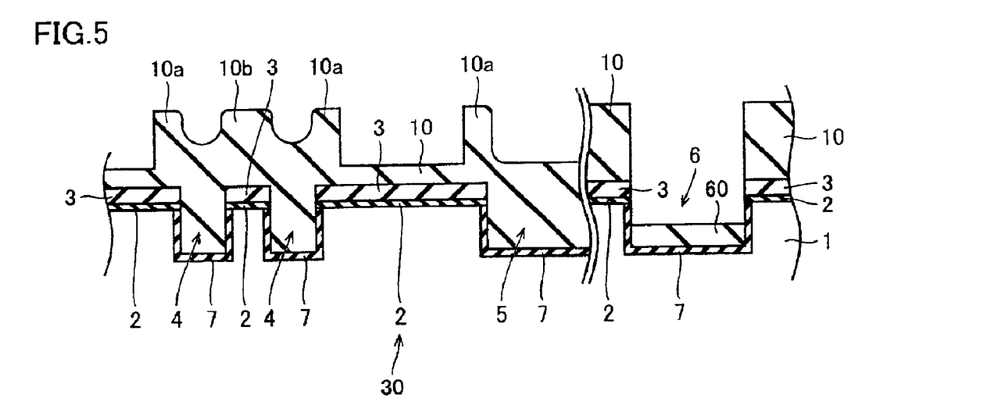

In the state shown in FIG. 5, the surface of the silicon oxide film 10 is removed by CMP through the silicon nitride films 3 serving as stopper films. In this case, the margins 10a of the silicon oxide film 10 and the part 10b located on the space between adjacent trenches 4, both having line widths of less than 100 μm, are quickly removed. The etched regions of the silicon oxide film 10 and the part of the silicon oxide film 10 located on the trench 5 are removed substantially at the same polishing speed. Consequently, the silicon oxide film 10 can be prevented from remaining on the silicon nitride films 3 located on the wide element regions 30 while the upper surface of part of the silicon oxide film 10 located on the trench 5 can be prevented from lowering. Thus, planarization can be excellently performed.

Figure 6:
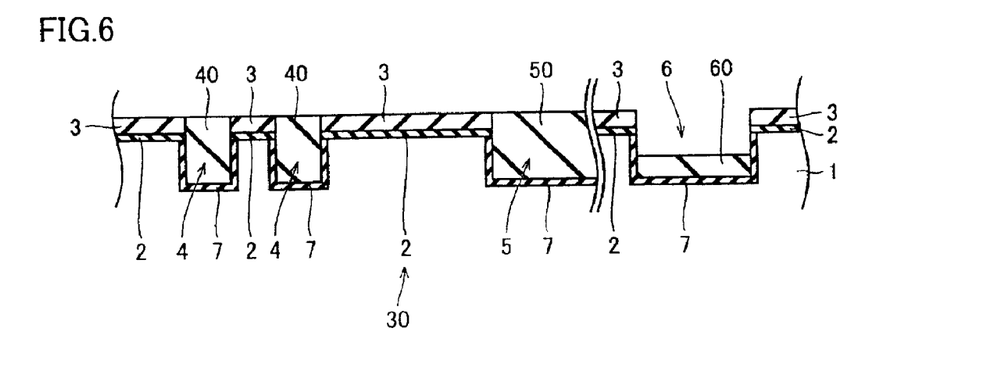

The silicon oxide film 10 and the silicon nitride films 3 are different in etching resistance against a chemical solution employed in the CMP step from each other, whereby planarization can be readily performed through the silicon nitride films 3 serving as stoppers. Thus, fillers 40 of silicon oxide are formed in the trenches 4 having small opening areas while a filler 50 of silicon oxide is formed in the trench 5 having a large opening area due to the planarization, as shown in FIG. 6. Thereafter the silicon nitride films 3 are separated with phosphoric acid and the thermal oxide films 2 are separated with dilute hydrofluoric acid, thereby obtaining a structure shown in FIG. 7.

Figure 7:
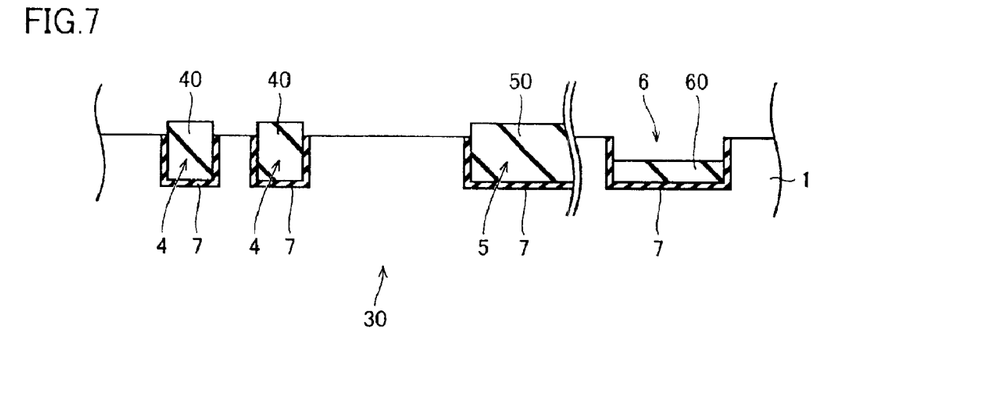

A sacrifice oxide film (not shown) is formed on the structure shown in FIG. 7 and ions are thereafter implanted into the element regions 30, thereby forming active regions (not shown) such as source and drain regions. Thereafter the sacrifice oxide film is separated with dilute hydrofluoric acid.

Figure 8:
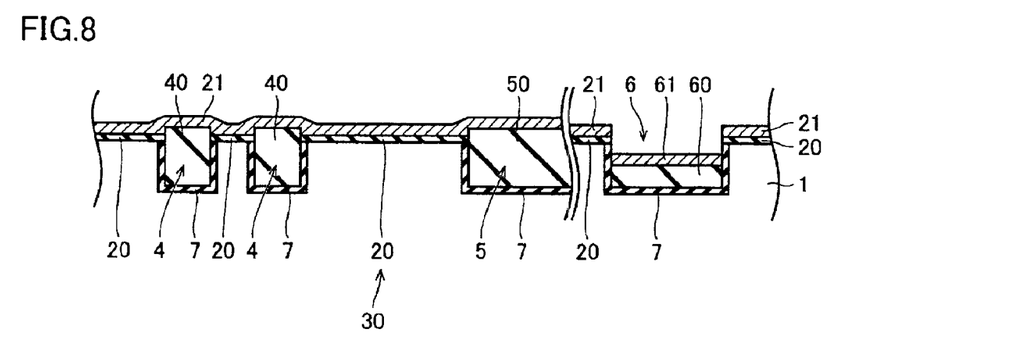

Then, a gate oxide film 20 is formed followed by formation of a gate electrode 21, as shown in FIG. 8.

The thickness of the aforementioned silicon nitride films 3 is set in previous consideration of thicknesses of parts of the fillers 40 and 50 of silicon oxide etched when the thermal oxide films 2 or the sacrifice oxide film is etched. Thus, the fillers 40 and 50 of silicon oxide filling up the trenches 4 and 5 can be finally formed in desired heights.

In the step shown in FIG. 8, a conductive layer 61 of the same material as the gate electrode 21 is formed also on the filler 60 filling up the position detection groove 6. In this case, the thickness of the filler 60 filling up the position detection groove 6 is so small that the upper surface of the conductive layer 61 formed on the filler 60 is lower than the edge of the position detection groove 6. Thus, a pattern of the semiconductor substrate 1 can be aligned with a mask pattern on an exposure apparatus in a subsequent lithography step through the step between the edge and the bottom (the upper surface of the conductive layer 61) of the position detection groove 6.

According to this embodiment, the parts of the silicon oxide film 10 deposited on the wide element regions 30 are etched by a prescribed thickness as described above so that the width of the parts of the silicon oxide film 10 having a large height can be reduced, whereby the parts of the silicon oxide film 10 having a large height can be readily removed in planarization by CMP. Thus, pattern dependency can be relaxed in planarization by CMP. Consequently, the planarized surface can be prevented from dispersion.

In the aforementioned embodiment, further, the mask layers 11 are formed not only on the part of the silicon oxide film 10 located on the trench 5 having a large opening area but also on the parts of the silicon oxide film 10 located on the element regions 30 so that the low upper surface portion of the silicon oxide film 10 located on the trench 5 is prevented from etching also when the mask layers 11 are displaced. In other words, a margin can be ensured on the fabrication process.

Although the present invention has been described and illustrated in detail, it is clearly understood that the same is by way of illustration and example only and is not to be taken by way of limitation, the spirit and scope of the present invention being limited only by the terms of the appended claims.

While the silicon oxide film 10 is deposited by about 600 nm in the aforementioned embodiment, for example, the present invention is not restricted to this but the silicon oxide film 10 may alternatively be deposited in a thickness larger than the distance between the bottoms of the trenches 4 and 5 and the upper surfaces of the silicon nitride films 3 serving as stopper films.

While the silicon oxide film 10 is etched by the quantity corresponding to the total of the depth of the trench 5 and the thickness of the silicon nitride films 3 after formation of the trench 5 in the aforementioned embodiment, the present invention is not restricted to this but the silicon oxide film 10 may alternatively be etched by another quantity so far as pattern dependency by CMP can be relaxed or eliminated.

While the silicon nitride films 3 are employed as the stopper films for CMP in the aforementioned embodiment, the present invention is not restricted to this but films of another material may alternatively be employed so far as the material can sufficiently attain selectivity with reference to the silicon oxide film 10 to be polished by CMP.

While the silicon oxide film 10 is anisotropically etched in the aforementioned embodiment, the present invention is not restricted to this but the silicon oxide film 10 may alternatively be isotropically etched. When isotropic etching is employed, the mask layers 11 are preferably formed to be sufficiently wider than the regions located on the trenches 4 and 5 in consideration of transverse side etching or the like.

While the position detection groove 6 is formed for position detection after formation of the gate electrode 21 in the aforementioned embodiment, the present invention is not restricted to this but position detection may alternatively be performed by another method after formation of the gate electrode 21.

While the above embodiment has been described with reference to trench isolation, the present invention is not restricted to this but also applicable to a step of filling up a contact hole formed in an interlayer dielectric film with a conductive material or the like. In this case, it is possible to effectively cope with undulation caused on the surface of the conductive material due to the contact hole to exert influence on controllability of CMP.

While the semiconductor substrate 1 is formed by a silicon substrate in the aforementioned embodiment, the present invention is not restricted to this but a semiconductor substrate consisting of a material such as a silicon-germanium alloy, silicon carbide, germanium, cadmium selenide, cadmium sulfide or gallium arsenide may alternatively be employed.

While the silicon oxide film 10 is planarized by CMP in the aforementioned embodiment, the present invention is not restricted to this but planarization may alternatively be performed by microblasting, for example. The microblasting is an etching technique of implementing fine working in high precision according to an air blasting principle of blowing powder to a workpiece through compressed air and a brittle fracture principle of employing fine abrasives of about 3 μm to 20 μm.

What is claimed is:

1. A method of fabricating a semiconductor device comprising steps of:
    forming an etching mask on a region of a semiconductor substrate and thereafter etching said semiconductor substrate through said etching mask thereby forming an opening;
    filling up said opening with a filler while forming said filler on said opening and on a non-opening part;
    forming a mask layer at least on a part of said filler located on said opening;
    etching a region, formed with no said mask layer, of a part of said filler located on said non-opening part by a thickness; and
    thereafter scraping an upper surface of said filler located on said opening and on said non-opening part stopping on said etching mask, thereby performing surface planarization, wherein
    the thickness to which said region of said part of said filler is etched is equal to the total of the depth of said opening and the thickness of said etching mask after formation of said opening.

2. The method of fabricating a semiconductor device according to claim 1, wherein
    said step of performing surface planarization includes a step of performing said surface planarization by polishing the upper surface of said filler by chemical mechanical polishing.

3. The method of fabricating a semiconductor device according to claim 1, wherein
    said non-opening part includes an element forming region formed on the surface of a semiconductor substrate, and
    said opening includes an element isolation trench formed on the surface of said semiconductor substrate.

4. The method of fabricating a semiconductor device according to claim 1, wherein
    said step of etching said region of said part of said filler includes a step of etching said region of said part of said filler by the thickness allowing elimination of pattern dependency when polishing said filler located on said non-opening part and on said opening by chemical mechanical polishing.

5. The method of fabricating a semiconductor device according to claim 4, wherein
    said step of etching said region of said part of said filler by the thickness includes a step of etching said region of said part of said filler so that an upper surface of etched said region of said part of said filler is substantially flush with an upper surface of said part of said filler located on said opening.

6. The method of fabricating a semiconductor device according to claim 1, wherein
    said step of forming said mask layer includes a step of forming said mask layer includes a step of forming said mask layer not only on said part of said filler located on said opening but also on a region of said part of said filler located on said non-opening part.

7. The method of fabricating a semiconductor device according to claim 6, wherein
    a width of a part of said mask layer formed on said region of said part of said filler located on said non-opening part is so set that an unetched portion, located under said mask layer, and an etched portion, not located under said mask layer, of said part of said filler located on said non-opening part are completely removed by said chemical mechanical polishing at substantially equal points of time.

8. The method of fabricating a semiconductor device according to claim 7, wherein
the width of said part of said mask layer formed on said region of said part of said filler located on said non-opening part is less than about 100 μm.

9. The method of fabricating a semiconductor device according to claim 6, wherein
said step of forming said mask layer includes a step of forming said mask layer substantially on an overall surface of a part of said filler located on a portion of said non-opening part having a small width while forming said mask layer on a part of said filler located on another portion of said non-opening part having a large width.

10. The method of fabricating a semiconductor device according to claim 9, wherein
a width of said part of said mask layer formed substantially on the overall surface of said part of said filler located on said portion of said non-opening part having a small width is less than about 100 μm.

11. The method of fabricating a semiconductor device according to claim 1, further comprising a step of forming a position detection groove in said non-opening part, wherein
said mask layer is formed on a region other than a region located on said position detection groove, and
said step of etching said region of said part of said filler by the thickness includes a step of also etching a part of said filler located in said position detection groove at the same time.

12. The method of fabricating a semiconductor device according to claim 1, further comprising steps of:
forming a silicon nitride film on a prescribed region of a semiconductor substrate, and
etching said semiconductor substrate through a mask of said silicon nitride film thereby forming an element isolation trench as said opening, wherein
said step of forming said filler includes a step of filling up said element isolation trench with said filler while forming said filler, including a silicon oxide film, on said element isolation trench and on said non-opening part, and
said step of performing surface planarization includes a step of performing said surface planarization by polishing the upper surface of said filler located on said element isolation trench and on said non-opening part by chemical mechanical polishing and stopping chemical mechanical polishing on said silicon nitride film.

13. The method of fabricating a semiconductor device according to claim 1, wherein
said step of performing surface planarization includes a step of performing said surface planarization by removing the upper surface of said filler by microblasting.

14. A method of fabricating a semiconductor device comprising steps of:
filling up an opening with a filler while forming said filler on said opening and on a non-opening part, the non-opening part having a position detection groove therein;
forming a mask layer at least on a part of said filler located on said opening but not on said position detection groove;
etching a region, formed with no said mask layer, of a part of said filler located on said non-opening part by a thickness through a mask of said mask layer while etching a part of said filler located in said position detection groove; and
thereafter scraping an upper surface of said filler located on said opening and on said non-opening part thereby performing surface planarization.

15. A method of fabricating a semiconductor device comprising steps of:
forming an etching mask on a region of a semiconductor substrate and thereafter etching said semiconductor substrate through said etching mask thereby forming an opening;
filling up said opening with a filler while forming said tiller on said opening and on a non-opening part;
forming a mask layer at least on a part of said filler located on said opening and on a region of said part of said filler located on said non-opening part;
etching a region, formed with no said mask layer, of a part of said filler located on said non-opening part by a prescribed thickness; and
thereafter performing surface planarization, wherein
a width of a part of said mask layer formed on said region of said part of said filler located on said non-opening part is less than about 100 μm, and wherein
the thickness to which said region of said part of said filler is etched is equal to the total of the depth of said opening and the thickness of said etching mask after formation of said opening.

\* \* \* \* \*